(12) United States Patent
Mansour

(10) Patent No.: US 8,127,105 B2
(45) Date of Patent: Feb. 28, 2012

(54) PARALLEL PRUNED BIT-REVERSAL INTERLEAVER

(75) Inventor: Mohamad Mansour, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 595 days.

(21) Appl. No.: 12/264,880

(22) Filed: Nov. 4, 2008

(65) Prior Publication Data

US 2010/0115227 A1   May 6, 2010

(51) Int. Cl.
   *G06F 12/00*   (2006.01)
(52) U.S. Cl. ........................................ 711/202; 714/755
(58) Field of Classification Search .................. 711/202; 714/755
   See application file for complete search history.

(56) References Cited

U.S. PATENT DOCUMENTS

| 2003/0149849 | A1* | 8/2003 | Kim et al. | 711/157 |
| 2004/0255217 | A1* | 12/2004 | Garrett et al. | 714/746 |
| 2006/0156199 | A1* | 7/2006 | Palanki et al. | 714/776 |
| 2008/0298487 | A1* | 12/2008 | Peron | 375/260 |

OTHER PUBLICATIONS

Mansour, M.M.: "Parallel channel interleavers for 3GPP2/UMB" IEEE Workshop on Signal Processing Systems, 2008. SIPS 2008, Oct. 8-10, 2008 pp. 55-60, XP002524470 the whole document.

* cited by examiner

*Primary Examiner* — Hashem Farrokh
(74) *Attorney, Agent, or Firm* — Stanton Braden

(57) ABSTRACT

A parallel lookahead pruned bit-reversal interleaver algorithm and architecture have been proposed. The algorithm interleaves a packet of length N in at most log(N)−1 steps compared to N steps using existing sequential algorithms, and has a simple architecture amenable for high-speed applications. The proposed algorithm is valuable for emerging wireless standards especially those that employ PBRI channel (de-)interleavers on long packets in reducing interleaving latency on the transmitter side and deinterleaving latency on the receiver side.

20 Claims, 5 Drawing Sheets

- *Pruned bit-reversal (de)interleaver*

- *1x-PBRI generates one valid address per cycle*

- _Pruned bit-reversal (de)interleaver_

- _1x-PBRI generates one valid address per cycle_

FIG. 2

$\delta_1[1:0]$      $\delta_2[3:0]$      $\delta_3[5:0]$      $\delta_4[6:0]$ $\delta_1$: 0 0 0 0 0 1 1    $\delta_2$: 0 0 0 1 1 0 1    $\delta_3$: 0 1 1 0 1 0 1    $\delta_3$: 1 0 1 0 1 0 1

$x$: 1 0 0 1 1 0 1    $x$: 1 0 0 1 1 0 1    $x$: 1 0 0 1 1 0 1    $x$: 1 0 0 1 1 0 1

$x[6:2]$   $x[1:0]$    $x[6:4]$   $x[3:0]$    $x[6]$   $x[5:0]$    $x[6:0]$ $x[6:2] = 19_{(10)}$      $x[6:4] = 4_{(10)}$      $x[6] = 1_{(10)}$      $x[6:0] = 1001101 < 1010101$ $x[1:0] = 01 < 11$      $x[3:0] = 1101 \geq 1101$      $x[5:0] = 001101 < 110101$      $\Rightarrow \sigma_4(x) = 0_{(10)}$ $\Rightarrow \sigma_1(x) = 19_{(10)}$      $\Rightarrow \sigma_2(x) = 4+1 = 5_{(10)}$      $\Rightarrow \sigma_3(x) = 1_{(10)}$ $\Rightarrow \sigma(x) = \sigma_1(x) + \sigma_2(x) + \sigma_3(x) + \sigma_4(x) = 25_{(10)}$

PARALLEL PRUNED BIT-REVERSAL INTERLEAVER

BACKGROUND

1. Field

The present invention relates generally to digital communications systems, and more specifically to a method and hardware architecture for parallel pruned bit-reversal interleaving.

2. Background

Communication systems use numerous techniques to increase the amount of information transferred while minimizing transmission errors. In these communication systems, the information is typically represented as a sequence of binary bits or blocks of bits called frames. The binary information is modulated to signal waveforms and transmitted over a communication channel. Communication channels tend to introduce noise and interference that corrupt the transmitted signal. At a receiver the received information may be corrupted and is an estimate of the transmitted binary information. The number of bit errors or frame errors depends on the amount of noise and interference in the communication channel.

To counter the effects of transmission channel corruption, channel interleaving error correction coding is often used in digital communication systems to protect the digital information from noise and interference and reduce the number of bit/frame errors. Channel interleaving is employed in most modern wireless communications systems to protect against burst errors. A channel interleaver reshuffles encoded symbols in such a way that consecutive symbols are spread apart from each other as far as possible in order to break the temporal correlation between successive symbols involved in a burst of errors. A reverse de-interleaving operation is performed at the receiver side before feeding the symbols to a channel decoder. Typically, these interleavers employ some form of bit-reversal operations in generating the interleaved addresses, and have a programmable size to accommodate for various encoded packet lengths. In one scheme, a pruned bit-reversal channel interleaver in its physical layer to interleave any packet of a length that is a multiple of 8. In pruned bit-reversal interleaving, a packet of size N is interleaved by mapping n-bit linear addresses into n-bit bit-reversed addresses, where n is the smallest integer such that $N \leq 2^n$. Linear addresses that map to addresses outside [0, N−1] are invalid addresses, which are pruned out.

Traditionally, interleavers and their architectures have been employed in turbo codes Bit-reversal mapping has been mainly applied to reduce row conflicts, improve hit-rates in SDRAM applications, and to improve the shuffle permutation stages of the Fast Fourier Transform (FFT) algorithm. In turbo interleavers, emphasis has been placed on reducing interleaving latency by avoiding memory collisions of read/write operations by the constituent (MAP) decoders. Such software programmable turbo interleavers for multiple 3G wireless standards are known.

PBRI interleavers have not traditionally been applied to channel interleaving because, despite their simplicity, interleaved addresses must be sequentially generated. In order to generate the interleaved address of a linear address x, the interleaved addresses of all linear addresses less than x must first be generated. This follows from the fact that the number of pruned addresses that have occurred before x must be known in order to know where to map x. This requirement introduces a serial latency bottleneck. Serial bottlenecks can be especially disadvantageous when (de-)interleaving long packets.

There is therefore a need in the art for an algorithm that efficiently determines any interleaved addresses and eliminates addressing dependency. Moreover, there is a need for the algorithm to have an easily implemented architecture that can be constructed using basic logic gates with a short critical path delay.

BRIEF DESCRIPTION OF THE DRAWINGS

FIG. 2 is an exemplary illustration of steps involved in computing invalid integers;

DETAILED DESCRIPTION

The word "exemplary" is used herein to mean "serving as an example, instance, or illustration." Any embodiment described herein as "exemplary" is not necessarily to be construed as preferred or advantageous over other embodiments.

In one or more aspects, a bit-reversal interleaver (BRI) is provided that maps an n-bit number x into another n-bit number y according to a simple bit-reversal rule such that the bits of y appear in the reverse order with respect to x. BRI mapping on n bits is denoted by the function y=BRI(n,x). The values taken by x range from 0 to $2^n-1$. A pruned BRI (PBRI) maps an n-bit number x<N, where $N \leq M$, into another n-bit number y<N according to the bit-reversal rule. Numbers from N to M−1 are pruned out of the interleaver mappings and are not considered valid mappings. The PBRI mapping on n bits is designated by the parameter N with the function y=PBRI(n,N,x). Traditionally, the PBRI(n,N,x) mappings are computed sequentially by starting from x=0, and the number of invalid mappings up to x, denoted by $\phi phi(x)$, is maintained. If BRI(n,x+φ(x)) is invalid, the next consecutive value x+φ(x)+1 is calculated, and the number of invalid mappings up to x is incremented by 1.

By definition of the bit-reversal rule, if x results in an invalidly mapped address, then x+1 maps to a valid number. Computing PBRI(n,N,x) requires x increment-compare operations in order to determine the number of invalid mappings φ(x) that have been skipped up to x. This traditional mapping computation results in an implementation bottleneck because φ(x) must be computed sequentially. Partly parallel implementations derive φ(x) for a block of L numbers in parallel by performing L increment-compare operations in parallel, resulting in a speed up by a factor of L. However, this improvement is most practical for small values of L (i.e. small blocks).

The following aspects present an easily implemented technique to determine φ(x) in a small constant number of operations (independent of x) by analyzing the bit-representation of the invalid mappings for a given N and M. These mappings are divided into classes, e.g., two classes C1 and C2 of size P1 and P2, respectively, where P2<P1. The first class partitions the set of M possible numbers into a number of P1 partitions that depend on the smallest number x such that PBRI(n,N,x) $\geq$ N. The second class C2 of invalid mappings has its P2 mappings distributed among the set of P1 partitions of C1 such that each partition includes at most one mapping from C2. Given an arbitrary x in [0,N−1], $\phi(x)$ is determined by simply computing the invalid addresses that belong to C1 and C2. Aspects of this technique advantageously enable a parallel implementation of a PBRI by breaking the serial bottleneck in determining $\phi(x)$ without block size limitations.

Figure 1A:
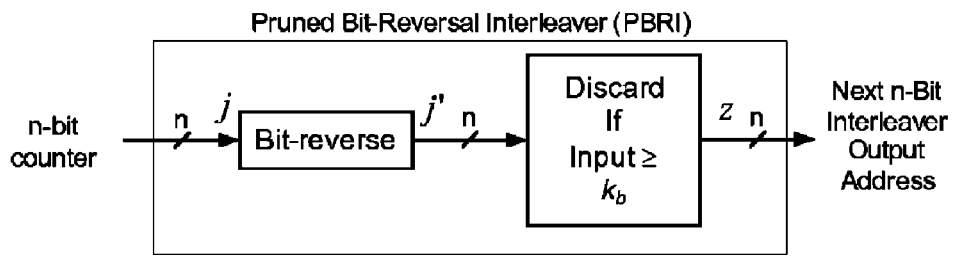
FIG. 1(a) and FIG. 1(b) are an exemplary illustrations of inteleaver schemes which may lead to invalid integer mapping.
Figure 1B:
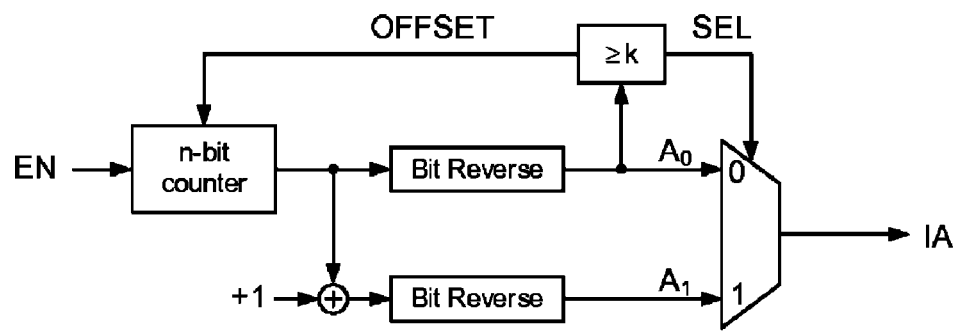

FIG. 1(a) and FIG. 1(b) are an exemplary illustrations of inteleaver schemes which may lead to invalid integer mapping. A BRI maps an n-bit number x into another n-bit number y according to a simple bit-reversal rule such that the bits of y appear in the reverse order with respect to x. The BRI mapping on n bits by the function $y=\pi_n(x)$. The values taken by x and y range from 0 to $2^n-1$, where $M \equiv 2^n$ is the size of the interleaver. A pruned BRI maps an n-bit number x less than N, where N$\leq$M, into another n-bit number y less than N according to the bit-reversal rule. The size of the pruned interleaver is N, while the size of mother interleaver is M. Note that the numbers from N to M−1 are pruned out of the interleaver mappings and are not considered valid mappings. The PBRI mapping on n bits with parameter N is designated by the function $y=B_{n,N(x)}$.

The mapping $B_{n,N(x)}$, for a given x is computed sequentially by starting from y=0 and maintaining the number of invalid mappings of $\phi(x)$ accrued to the present point. If y+$\phi(x)$) maps to a valid number (i.e., $\pi_n(y+\phi(x))<N$) 102, then y is incremented by 1. If y+$\phi(x)$ maps to an invalid number, $\phi x$) is incremented by 1. These operations are repeated until y reaches x, and $\pi_n(x)$ is valid.

Algorithm 1 shows the pseudocode of the sequential PBRI algorithm:

---
Algorithm 1 - Sequential PBRI algorithm procedure PBRI-SEQ( n N x )
  y ← 0
  $\phi$ (x)← 0
  while y ≦ x do
    if $\pi_n$ (y + $\phi$ (x)) ≧ N then
      $\phi$ (x)← $\phi$ (x)+ 1
    else
      $B_{n,N(x)}$ ← $\pi_n$ (y + $\phi$ (x))
      y ← y + 1
    end if
  end while
end procedure

---

Example 1

Table I shows the mappings computed using Algorithm 1 assuming n=4 and N=12. In this example, $M=2^4=16$, so 4 mappings are pruned by $B_{4,12}$.

TABLE I

BRI AND PBRI MAPPINGS FOR n = 4 N = 12.

| x | $\Pi_4$ (x) | $\phi$ (x) | $B_{4,12}$ (x) |
|---|---|---|---|
| 0000 | 0000 | $\phi$ (0) = 0 | 0000 |
| 0001 | 1000 | $\phi$ (1) = 0 | 1000 |
| 0010 | 0100 | $\phi$ (2) = 0 | 0100 |
| 0011 | 1100 | $\phi$ (3) = 1 | 0010 |
| 0100 | 0010 | $\phi$ (4) = 1 | 1010 |
| 0101 | 1010 | $\phi$ (5) = 1 | 0110 |
| 0110 | 0110 | $\phi$ (6) = 2 | 0001 |

TABLE I-continued

BRI AND PBRI MAPPINGS FOR n = 4 N = 12.

| x | $\Pi_4$ (x) | $\phi$ (x) | $B_{4,12}$ (x) |
|---|---|---|---|
| 0111 | 1110 | $\phi$ (7) = 2 | 1001 |
| 1000 | 0001 | $\phi$ (8) = 2 | 0101 |
| 1001 | 1001 | $\phi$ (9) = 3 | 0011 |
| 1010 | 0101 | $\phi$ (10) = 3 | 1011 |
| 1011 | 1101 | $\phi$ (11) = 3 | 0111 |

In the following, the size of the pruned interleaver (N) is more than half the size of the mother interleaver (M), i.e., N>M/2. Otherwise, the problem can be reformulated such that M is the smallest power-of-2 greater than or equal to N. Additionally, if N=M, then $\phi(x)=0$ for all x and $B_{n,N(x)}=\pi_n(x)$. There are no pruned integers in this case since all integers have valid mappings. Hence this case is degenerate. Hereafter, we assume that $$\frac{M}{2} < N < M. \quad (1)$$

From the definition of the bit-reversal operation and condition (1), it follows that if $\pi_n(x) \geq N$, then $\pi_n(x+1)<N$. In other words, two consecutive numbers cannot both have invalid mappings. This fact provides a recursive definition of $\phi(x)$ for $0 \leq x < N$:

$$\phi(x) = \begin{cases} 0, & \text{if } x = 0 \\ \phi(x-1), & \text{if } \pi_n(x + \phi(x-1)) < N; \\ \phi(x-1) + 1, & \text{otherwise.} \end{cases} \quad (2)$$

If y>x, then $\phi(y) \geq \phi(x)$, and hence $\phi$ is a non-decreasing function With reference to Table I, invalid bit reversals are flagged by incrementing $\phi(x)$ each time an invalid bit reversed sequence is generated. For instance the bit reversal of 0011 is flagged by incrementing $\phi(3)$ to 1 since the bit reversed sequence 1100 is invalid due to the fact that $1100_2$ is equal to 12 and N=12. the next value in the bit reversed sequences $\pi_4(x)$ in Table 1 is used in it's place, i.e., 0010. The $6^{th}$ entry, 0110 would otherwise have mapped to a valid entry using a strict bit reverse procedure. However, the procedure dictates that the next entry in the listing be used and that invalid listings be skipped. The previous listing would result in 1110 being used for the mapping for 0110. However since 1110 is greater than 12, and thus invalid, 0001, the next in the sequence of bit reversed sequences is used. With further reference to Table 1, it is observed that for a given sequence number x (which may, for instance, represent a data address) adding the respective ø to x and bit reversing the sum will provide a valid bit reversed $B_{n,N}(x)$ result. For instance, 0011+ø(3)=0100. $B_{4,12}(0011)=0010$, a valid mapping rather than the simple bit reversal of 0011 which otherwise is a invalid mapping $1100=\pi_4(0011)$

Example 2

In another example, wherein N=96, n=7, x=9, $\phi(9)$ is determined recursively using (2) as shown in the Table II. $\phi(9)=3$. Although not shown, the representations for x are probably best appreciated as a binary representation. For instance x=0 for n=7 is best represented $0000000_2$. Therefore, the first entry with x=1, i.e., $0000001_2$ bit reverses to $1000000_2$ or 64. As shown in Table II, 64 is less than 96 and the properties of Equation (2) are satisfied accordingly with values for $\phi(x-1)$, $\phi(x-1)+1$ and $\pi_7(x+\phi(x-1))$ and $\phi(x)$ being indicated therefore.

TABLE II

RECURSIVE COMPUTATION OF φ (9) USING Equation (2).

| x | φ (x − 1) | φ (x − 1) + 1 | Π₇ (x + φ (x − 1)) | φ (x) |
|---|---|---|---|---|
| 0 | — | — | 0 | 0 |
| 1 | 0 | 1 | 64 < 96 | 0 |
| 2 | 0 | 1 | 32 < 96 | 0 |
| 3 | 0 | 1 | 96 ≧ 96 | 1 |
| 4 | 1 | 2 | 80 < 96 | 1 |
| 5 | 1 | 2 | 48 < 96 | 1 |
| 6 | 1 | 2 | 112 ≧ 96 | 2 |
| 7 | 2 | 3 | 72 < 96 | 2 |
| 8 | 2 | 3 | 40 < 96 | 2 |
| 9 | 2 | 3 | 104 ≧ 96 | 3 |

Theorem 1: Algorithm 1 with x=N−1 maps the set of integers [0, N−1] into [0, N−1] in exactly M−1 iterations for M/2<N<M. In addition, the algorithm prunes exactly M−N−1 integers before it terminates. Hence, the time complexity of a PBRI is determined by the size of its mother interleaver M and not N.

Theorem 1 above sets forth that Algorithm 1 always performs M−1 iterations in mapping the integers in [0, N−1], for any N satisfying (1). In other words, the algorithm traverses all the integers in [0,$2^n$−2] when mapping the integers [0, N−1] independent of N, always pruning M−N−1 integers to the point reached. M−1 is a palindrome, such that $\pi_n$(M−1)= M−1≧N so M−1 maps to an invalid number. Hence the algorithm terminates before M−1, which leaves only M−N−1 invalid integers to be pruned.

Determining the Invalid Mappings φ(x)

The time complexity of Algorithm 1 is O(M), which follows directly from the fact that the number of invalid mappings φ(x) that have occurred in mapping all integers less than x must first be computed in order to determine what value x maps to. In the following, we present an algorithm to determine φ(x) with complexity O($\log_2$(M)) by analyzing the bit-structure of the invalid mappings.

Note that φ(x) represents the minimum number of integers that must be skipped such that all integers from 0 to x have valid mappings. Equivalently, φ(x) represents the minimum number that needs to be added to x such that there are exactly x+1 integers in the range [0,x+φ(x)] that have valid mappings. This quantity is not necessarily equal to the number of integers less than x that have invalid mappings, which we denote by σ(x). In fact, φ(x)≧σ(x) [see FIG. 1]. This follows from the fact that for the σ(x) integers in the range [0,x] with invalid mappings, at least $\sigma^1(x)\equiv\sigma(x)$ more integers greater than x must be tried to check if they have valid mappings. But the numbers from x+1 to x+σ(x) can in turn have invalid mappings that must be taken into account. So φ(x) is at least equal to number of invalid mappings in the range [0, x+$\sigma^1$(x)], which is given by $\sigma^2(x)\equiv\sigma(x+\sigma^1(x))$. Similarly, the numbers from x+$\sigma^1$(x)+1 to x+$\sigma^2$(x) can in turn have invalid mappings that must be taken into account. So φ(x) is at least equal to number of invalid mappings in the range [0, x+$\sigma^2$(x)], which is given by $\sigma^3(x)\equiv\sigma(x+\sigma^2(x))$. The process is repeated for k steps until the interval [0,x+$\sigma^k$(x)] contains exactly x+1 valid mappings:

$$(x+\sigma^k(x))+1-\sigma(x+\sigma^k(x))=x+1$$

or equivalently until $\sigma^k(x)=\sigma(x+\sigma^k))\ldots\sigma^{k+1}(x)$. Then, φ(x) $\sigma^k$(x). Algorithm 2 shows the pseudo-code of the ø-algorithm that computes φ(x) iteratively using σ(x)

Algorithm 2 φ-algorithm procedure φ-ALGORITHM(n, N, x)
  k ← 0
  $\sigma^0$(x) ← 0
  repeat
    $\sigma^{k+1}$(x) ← σ(x + $\sigma^k$(x))
  until ($\sigma^{k+1}$(x) = $\sigma^h$(x))
  φ(x) ← $\sigma^k$(x)
  $\beta_{n,N}$(x) ← $\pi_n$(x + φ(x))
end procedure One important aspect of Algorithm 2 is that the valid bit reversed value for a given number in a given sequence can be determined from the indexed φ and given number. For instance, the $12^{th}$ entry in Table I with x=1011 is determined to have a mapping using Algorithm 2 according to the bit reversed value of x added to φ(11). φ(11) is equal to 3 or $0011_2$. The 12 entry for x or $1011_2$ added to $0011_2$ gives $1110_2$. The mapped value $\pi_n$(x+φ(x)) according to the φ-algorithm is therefore $0111_2$, the bit reversed value of $1110_2$.

Theorem 2: The φ-algorithm converges to φ(x) in at most n−1 iterations.

Effectively, valid bit reversed addresses can be generated using values of ø and σ with ø converging in at most n−1 iterations.

Determining σ(x)

In view of Theorem 2 above, the problem of determining φ(x) reduces to that of determining σ(x). We next present an algorithm to determine σ(x) by studying the bit-representation of the invalid numbers from N to M−1. The binary representation of x<$2^n$ by $$x=x_{n-1}x_{n-2}\ldots x_1x_0, x_i=0 \text{ or } 1$$

where $x_{n-1}$ is the most significant bit (MSB) and $x_0$ is the least significant bit (LSB). We use the notation x[i:j] to represent the set of consecutive bits $x_i$, $x_{i-1}$, ..., $x_j$ ordered from MSB to LSB. The concatenation of two bit strings x[i1:j1] and x[i2:j2] is represented as y=y=x[$i_1$:$j_1$]|x[$i_2$:$j_2$].

Considering the bit-representation of the numbers between N and M−1 these numbers can be classified by their most significant bits according to the bit-representation of N−1 as follows. Let z denote the number of zero bits in the bit-representation of N−1, and I' be the index set of those zeros ordered from most-significant to least-significant bit. For example, if N−1=1010100, then z=4, I'={5, 3, 1, 0}. Then the numbers 1010101≦x≦1111111 can be classified into 4 classes as follows (x represents don't care): C'₁: 11xxxxx (32 numbers); C'₂: 1011xxx (8 numbers); C'₃: 101011x (2 numbers); C'₄: 1010101 (1 number).

The MSBs that define these classes are determined by scanning the bits of N−1 from left to right, searching for the zero bits. The MSBs of the first class correspond to the MSBs of N1 up to the first zero, and then flipping the first zero to one. The MSBs of the second class correspond to the MSBs of N−1 up to the second zero, and then flipping the second zero to one. The MSBs of the remaining classes are similarly obtained. Mathematically, the smallest number in each of the z classes can be expressed as $$\delta'_i = \left(\left\lfloor \frac{N-1}{2^{I'(i)}} \right\rfloor + 1\right) \cdot 2^{I'(i)}; i = 1, 2, \ldots, z \quad [2.5]$$

Each class is designated by its smallest number $\delta'_i = (\lfloor(N-1)/(2^{r(i)}\rfloor+1, I=1, 2, \ldots, z \ldots$. Table III shows the 3 classes for the case N=10011: class of $\delta'_1$=11000, class of $\delta'_2$=10100, and class of $\delta'_3$=10011.

The numbers of interest are the set of integers, which when bit-reversed, become invalid. These integers belong to the above defined classes, but in bit-reversed order. Define $\delta_i = \pi(\delta'_i)$, i=1, 2, ... z and let $C_i$ be the corresponding classes. The $\delta_i$'s represent the classes of invalid numbers in bit-reversed order. Also, let I denote the index set of the zero bits of $\pi_n(N-1)$ ordered from LSB to MSB. Hence, if x∈$C_i$, then $\pi_n(x) \geq N$ and $x[I(i):0] = \delta_i[I(i):0]$.

TABLE III

INVALID CLASSES $C_i'$ AND $C_i$ FOR M = 32 AND N = 19.

| M = 32, N = 19 | $C_i'$ Classes | $C_i$ Classes |
|---|---|---|
| 0 | 00000 | 00000 |
| 1 | 00001 | 00001 |
| 2 | 00010 | 00010 |
| 3 | 00011 | 00011 ← $\delta_1$ |
| 4 | 00100 | 00100 |
| 5 | 00101 | 00101 ← $\delta_2$ |
| 6 | 00110 | 00110 |
| 7 | 00111 | 00111 |
| 8 | 01000 | 01000 |
| 9 | 01001 | 01001 |
| 10 | 01010 | 01010 |
| 11 | 01011 | 01011 |
| 12 | 01100 | 01100 |
| 13 | 01101 | 01101 |
| 14 | 01110 | 01110 |
| 15 | 01111 | 01111 |
| 16 | 10000 | 10000 |
| 17 | 10001 | 10001 |
| 18 | 10010 | 10010 |
| 19 | 10011 ← $\delta_3'$ | 10011 |
| 20 | 10100 ← $\delta_2'$ | 10100 |
| 21 | 10101 | 10101 |
| 22 | 10110 | 10110 |
| 23 | 10111 | 10111 |
| 24 | 11000 ← $\delta_1'$ | 11000 |
| 25 | 11001 | 11001 ← $\delta_3$ |
| 26 | 11010 | 11010 |
| 27 | 11011 | 11011 |
| 28 | 11100 | 11100 |
| 29 | 11101 | 11101 |
| 30 | 11110 | 11110 |
| 31 | 11111 | 11111 |

Example 3

Let N−1=1010100. Then $\pi_n$(N−1)=0010101, z=4, I={1,3,5,6}. The classes of invalid numbers in bit-reversed order are C1: uuuuu11, C2: uuu1101, C3: u110101, and C4: 1010101, with $\delta_1$=0000011, $\delta_2$=0001101, $\delta_3$=0110101, and $\delta_4$=1010101.

The number of invalid mappings (x) up to and including x can be determined by counting the number of invalid mappings belonging to each class $C_i$, i=1, 2 . . . z. The number of invalid mappings belonging to class $C_i$ is denoted by $\sigma_i(x)$, and $\sigma_i(x)$ can be determined 1) $\delta_i$, 2) MSBs of x to the left of the ith zero, x[n−1:I(i)+1], and 3) the remaining LSBs of x to the right of and including the ith zero, x[I(i):0].

The most significant (n−I(i)−1) bits x[n−1:I(i)+1] represent the number of integers belonging to $C_i$ that have appeared before x, i.e., those integers that have the same (I(i)+1) LSBs as $\delta_i$ but are less than x[n−1:I(i)+1]|i[I(i):0]. The least significant (I(i)+1) bits x[I(i):0] are used to check if x≧x[n−1:I(i)+1]|$\delta_i$[I(i):0], or equivalently, if x[I(i):0]≧δi[I(i):0]. This checks if x itself maps to an invalid integer in $C_i$, or if x maps to an integer greater than the last invalid integer in $C_i$. In either case, i(x) is incremented by 1. Mathematically, but loosely represented, $\sigma_i(x)$ can be expressed as:

$$\sigma_i(x) = \begin{cases} x[n-1:I(i)+1], & \text{if } x[i-1:0] < \delta_i[I(i):0] \\ x[n-1:I(i)+1]+1, & \text{otherwise,} \end{cases} \quad [3]$$

and σ(x) is sum the sum of all $\sigma_i(x)$s corresponding to all z classes $$\sigma(x) = \sum_{i=1}^{z} \sigma_i(x) \quad [4]$$

FIG. 2 is an exemplary illustration of steps involved in computing $\sigma_i(x)$s As with Example 3, N−1=1010100, $\pi_n$(N−1)=0010101, z=4, I={1,3,5,6}. The number of invalid mappings σ(x) up to and including x can be determined by counting the numbers of invalid mappings belonging to each class $C_i$, i=1, 2 . . . z with the number of invalid mappings belonging to class $C_i$ being denoted by a $\sigma_i(x)$. $\sigma_i(x)$ is then determined as shown in FIG. 2 by 1) $\delta_i$, 2 Most significant bits (MSBs) of x to the left of the ith zero, x[n−1:I(i)+1] and 3) the remaining least significant bits (LSBs to the right of and including the ith zero, x[I(i):0].

For $\delta_1$, according to Equation 2.5, with N−1 being equal to $1010100_2$ or rather $84_{10}$, I'(1) is equal to 5, I'(2) is equal to 3, I'(3) is equal to 1 and I'(4) is equal to 0 given that I'={5,3,1,0}. Note that I' reflects the location of zeros in N−1 from MSB to LSB while I reflects the location of zeros in $\pi_n$(N−1) from LSB to MSB. Thus I'={5,3,1,0}, while I={1,3,5,6}. I'(1) is equal to 5 and thus $2^{I'(1)}$ is therefore equal to 32. The truncated whole number in N−1/$2^{I'(1)}$ or the truncated number in 84/32 is 2. and $\delta_1'$ is equal to $(2+1)*32=96_{10}$. $\delta_1'$ is therefore equal to 1100000. I'(2) equals 3. $2^{I'(2)}$ equals 8. The truncated whole number in N−1/$2^{I'(2)}$ or the truncated number in 84/8 is 10. and $\delta_2'$ is equal to $(10+1)*8=88_{10}$. $\delta_2'$ is equal to 1011000. $\delta_3'$ and $\delta_4'$ are figured similarly at 1010110 and 1010101. Bit reversing, $\delta_1$ equals 0000011, $\delta_2$ equals 0001101, $\delta_3$ equals 0110101 and $\delta_4$ equals 1010101 as shown in FIG. 2. With n being defined as the smallest integer such that N≦$2^n$ with N being $85_{10}$ means that n=7. Turning to equation (3), x[6:I(1)+1] is equal to x[6:2] which is $19_{10}$. Further, the last two digits in x=1001101, or 01 are less than the last two digits in $\delta_1$. More importantly, this means that the bit reversed x, 1001101, is less than $\delta_1'$=1100000, which is the smallest number providing an upper limit in valid bit reversed representations. Therefore, any bit reversed number ranging from 1100000 to 1111111 is off limits as a valid bit reversed representation. This is a range from $96_{10}$ to $126_{10}$. Within this range, for an x value of 1001101, as shown in FIG. 2, there are 19 representations less than x=1001101 which are invalid. Specifically, these 19 representations are as follows: 0000011, 0000111, 0001011, 0001111, 0010011, 0010111, 0011011, 0011111, 0100011, 0100111, 0101011, 0101111, 0110011, 0110111, 0111011, 01111111, 1000011, 1000111 and 1001101. This is easily demonstrated by counting upward from the smallest integer in the $C_1$ class or 0000011 ($C_1'$ being the invalid bit reversed formatted number, 1100000, since any x with $\pi_n$(x)≧1100000 is invalid). This follows since for FIG. 2, N−1=1010100 or $84_{10}$, meaning N=$85_{10}$. A mapping of x which is greater than or equal to 1100000 or $96_{10}$ (i.e. to the lower limit of class $C_1'$ maps outside of addresses [0, N−1], or rather [0, $85_{10}$], which by definition is an invalid mapping, e.g., as noted previously, mappings outside of [0,N−1] get pruned out. Thus, for sequence generation of an x from 0000011 to an x of 1001101, there are 19 invalid mappings.

For the next invalid class, $C_2$, which has been determined to start from 0001101, i.e., for a $C_2'$ mapping resulting in a mapping greater than 1011000 (that is $\delta_2'$) or $88_{10}$, there are 5 invalid mappings starting from 62 or 0001101 to x=1001101. Once again, it should be noted that mappings outside of the range from [0, N−1], or in this case from [0,84], get pruned out. These numbers will have the form uuu1101 (u being a don't care). As shown in FIG. 2, there are 5 representations in this category from bit reverse sequences generated from 0001101 to x less than or equal to 1001101. This ranges from $13_{10}$ to $77_{10}$ or 64. Specifically, these invalid representations are 0001101, 0011101, 0101101, 0111101 and 1001101.

For the next invalid class, $C_3$ which has been determined to start from 0110101, i.e. for a $C_3'$ mapping resulting in a mapping greater than 1010110 (that is $\delta_3'$) or $86_{10}$, which is outside of the range [0, 84], there is only one representation of the form u110101 up to x=1001101. Specifically, this is 0110101.

Finally, $C_4$ or 1010101 is the last form of invalid bit reversal forms shown in FIG. 2. $C_4'$ maps to 1010101 which is $85_{10}$. However, $85_{10}$ is outside of the range [0,84] and the one number in this case, specifically 1010101 is an invalid bit reversed representation that will be pruned.

In all, summing up the number of invalid representations for each class, or σ(x) is shown as being equal to 25 in FIG. 2 for an N=85, from x=0000011 through x=1001101.

Algorithm 3 below illustrates the pseudo-code which summarizes the procedure for computing $\sigma_i(x)$ using the method described above which is loosely summarized by equation 3 together with equation 4.

---

Algorithm 3 σ-algorithm procedure σ-ALGORITHM(n, N, x)
    x ← number of 0's in N − $1_{(2)}$
    I ← index set of 0's in N − $1_{(2)}$ from LSB to MSB
    for i ← 1, x do
        $\sigma_i(x)$ ← x[n − 1 : I(i) + 1]
        if x[I(i) : 0] ≧ $\delta_i$[I(i) : 0] then
            $\sigma_i(x)$ ← $\sigma_i(x)$ + 1
        end if
    end for
    σ(x) ← $\Sigma_{i=1}^{x} \sigma_i(x)$
end procedure

---

Figure 3:
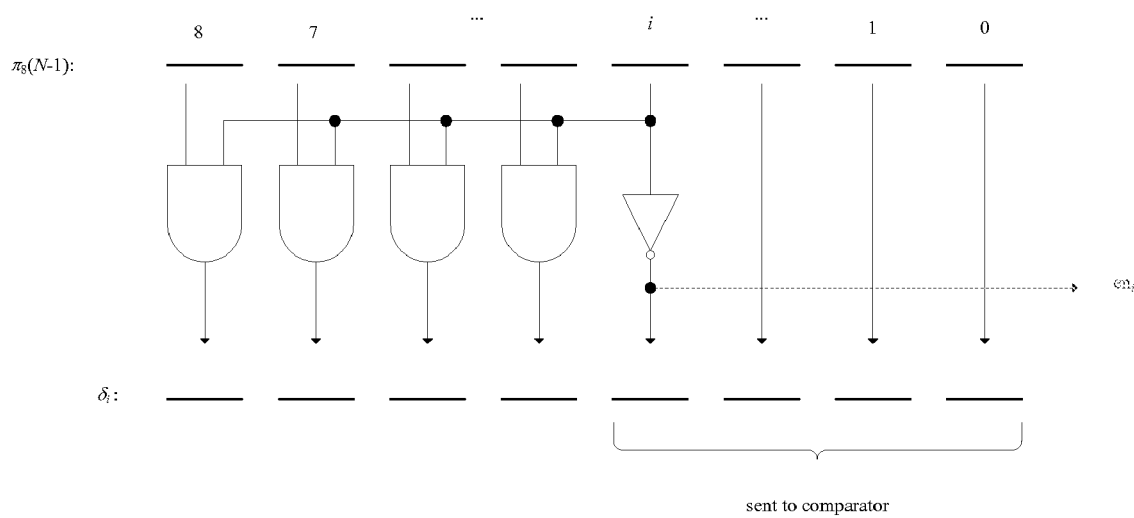
FIG. 3 shows an exemplary hardware architecture implementation for computing valid and invalid integers.

FIG. 3 shows an exemplary hardware architecture implementation for computing valid and invalid integers. FIG. 3 shows the logic circuit for computing the i's. The maximum number of zero bits in N−1 is n−1, so the circuit generates (n−1) $\delta_i$ outputs, i=1, ... n−1. For instance, if N=19 and N≦$2^n$, then n=5 and n−1=4. So for N=19, the circuit in FIG. 3 generates 4 $\delta_i$ outputs from i=1 to i=4. For each output, an enable signal $en_i$ is also generated to indicate whether the output $\delta_i$ is valid or not. If the ith least significant bit of $\pi_n$(N−1) is 1, then $\delta_i$ is not defined.

Figure 4:
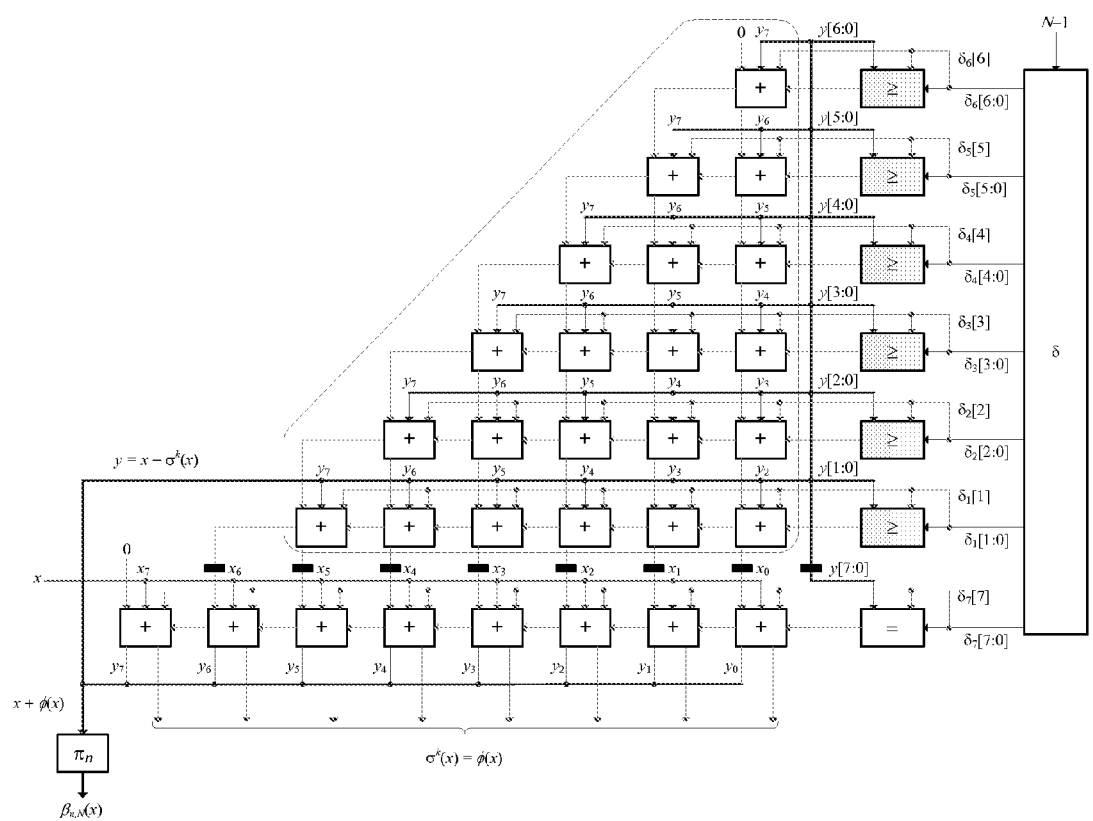
FIG. 4 shows an exemplary hardware architecture implementation for a parallel pruned bit-reversal interleaver.

FIG. 4 shows the architecture of a device for carrying out the ø-algorithm (Algorithm 3) for n=8 using 1-bit full adder cells, comparators, and a δ-circuit. The adder rows implement the σ-algorithm by accumulating right shifted copies of y (i.e., $\sigma_i(y)$s depending on the control signals from the δ-circuit, where y=x+$\sigma^k(x)$ is the input to the -algorithm at iteration k. If $\delta_i$ is valid, then $\sigma_i(y)$ is accumulated. The last row of adder cells adds x to the accumulated sum of $\sigma_i$s, and the total sum is fed back after the pipeline registers to compute the next a at iteration k+1.

The adder cells take two input bits to add and an enable signal from the top, a carry-in input from the right, and generate a sum bit from the bottom and carry-out bit from the left. If the enable bit is de-asserted, the $y_i$ input bits are zeroed out. The comparators generate a one if y[i:0]≧$\delta_i$[i:0], which is fed as an input carry to the first adder cell in each row.

This effectively adds 1 to $\sigma_i(y)$ if y[i:0]≧$\delta_i$[i:0]. Finally, the adder cells in the last row generate an extra output (right) that corresponds to adding a 1 to $\sigma_n(x)$ if $\sigma_n(x)$≧N−1. But since the maximum value of $\delta_n(x)$ is N−1, an equality comparator is sufficient. The left output from the adder cells in the last row after the pipeline registers corresponding to x+$\sigma^k(x)$ is fed back as a new input to the next iteration. The critical path delay of the architecture is 2n−2 stages, which easily meets timing requirements in ASIC applications in current process technologies for values of n up to 16. The unsigned comparators introduce negligible delay because they can be implemented using XOR trees.

The output of the ø-architecture is sampled every n−1 clock cycles to read out ø(x). A comparator can be added (not shown here) to compare $\sigma^k(y)$ and $\sigma^{k+1}(y)$ for early termination. The sum x+ø(x) is also generated, which when read in reverse order, is equivalent to $B_{n,N}(x)$.

Figure 5:
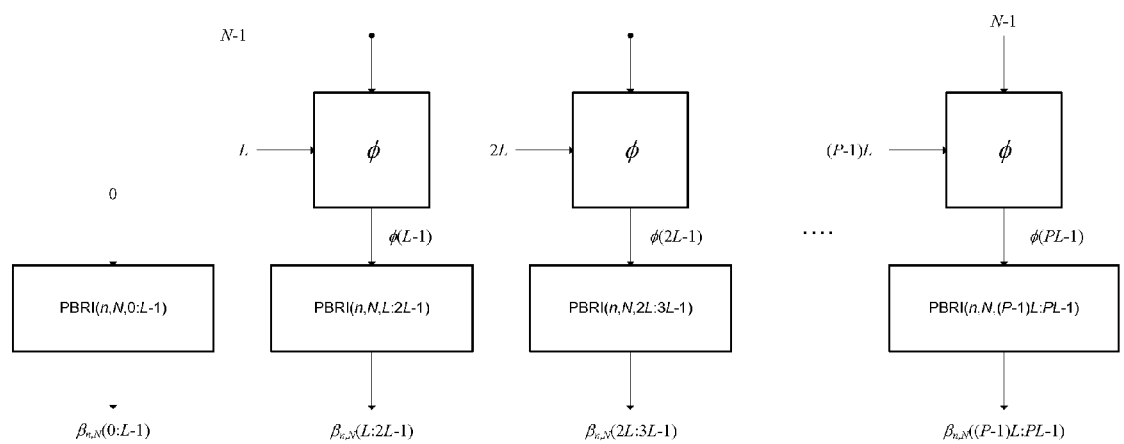
FIG. 5 shows an exemplary hardware architecture implementation for a parallel look ahead PBRI using the parallel pruned bit-reversal interleaver algorithm.

FIG. 5 shows a parallel lookahead PBRI architecture using the ø-algorithm. A packet of length N is divided into P sub-packets of length L, where each sub-packet is interleaved independently. As shown in FIG. 5 the PBRI can be divided into 4 sections with each section computing a corresponding $B_{n,N}(x)$,—in this case ø(L−1), ø(2L−1) and ø(3L−1). For instance, with L=4, 4 ø-blocks can be computed: ø(0), ø(4−1)=ø(3), ø(2L−1−1)=ø(7) and ø(3L−1)=ø(11). The values for that shown in Table 1 are as follows: ø(0)=0, ø(3)=1; ø(7)=2 and ø(11)=3. The ø-block for sub-packet i computes the number of invalid integers skipped in the interval [0, i*L−1]. Then φ(i*L−1) is used to initialize the ith component PBRI interleaver to interleave sub-packet i. This allows invalid bit reverse values to be skipped, or pruned out during the interleave process. The sequential PBRI algorithm (Algorithm 1) can be used ideally for small values of L (up to about 16). Further, a parallel component PBRI can be implemented to interleave L integers in parallel by using 2L adders, 2L comparators, a multiplexer, and control logic. It has been determined that for a sub-packet of length L, there can be at most L invalid integers in an interval spanning 2L integers. Hence the ith component PBRI maps the L integers i*L, i*L+ ... (i+1)*L−1 into the first L valid interleaved addresses in the interval [i*L+ø(i*L−1), i*L+ø(i*L−1)+2L−1]. It computes 2L sums {i*L+ø(i*L−1)}, {i*L+ø(i*L−1)+1, {i*L+ø(i*L−1)}+2, ..., {i*L+ø(i*L−1)}+2L−1, and compares their bit-reversed values with N−1 to check whether they are valid. If, in fact, the bit-reversed values are valid, the valid addresses get passed by the control logic through the multiplexer. Consequently, rather than generating a bit reversed sequence and checking validity, the Parallel Lookahead BRI maps past the invalid integers in a class. However, the complexity of this scheme rapidly increases for larger values of L. The architecture of the lookahead interleaver in FIG. 5 attains a speedup by a factor of P using a serial component PBRI, and by a factor of N using a parallel component PBRI, over a fully sequential PBRI architecture.

With reference to Table 1 in conjunction with FIG. 5, a more specific explanation of the parallel Lookahead BRI shall be provided. $B_{n,N}(x)$ shown in Table 1 may be generated in a parallel fashion using the architecture shown in FIG. 5. Given the 12 addresses, x, from 0000 to 011 subject to bit reversal, an invalid bit reversed entry will equal or exceed $N=12_{10}$ or $1100_2$. With $N=12 \leq 2^L$ a parallel lookahead PBRI (PLPBRI) with 4 sections (i.e, sub-PLPBRIs), or as referred to herein, taps may be chosen to produce outputs $B_{n,N}(x)_s$ corresponding to certain ranges of x. Tap PBRI(n,N,0:L−1) produces an output for x between 0000 through 0011. Tap PBRI(n,N,L:2L−1) produces an output for x between 0100 through 0111. Tap PBRI(n,N,2L:3L−1) produces an output for x between 1000 and 1011. The final tap PBRI(n,N,3L:4L−1) is unused in this example, but could be employed in another application where N>12. The parallel Lookahead BRI of FIG. 5 as used with the example of Table will produce respective outputs of $B_{n,N}(x)$ corresponding to a specified x over a specified range. For instance, PBRI(n,N,0:L−1) will produce $B_{4,12}(0)=0000$ for X=0000; PBRI(n,N,L:2L−1) will produce $B_{4,12}(4)=1010$ for X=0100 and PBRI(n,N,2L:3L−1) will produce $B_{4,12}(8)=0101$ for X=1000. The next clock cycle, PBRI(n,N,0:L−1) will produce $B_{4,12}(1)$, PBRI(n,N,L:2L−1) will produce $B_{4,12}(5)$, PBRI(n,N,2L:3L−1) will produce $B_{4,12}(9)$ and so forth. Three outputs in parallel are provided in parallel each clock cycle.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal. More specifically, the methods described may be carried out using a computer programmed product employing the foregoing.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed:

1. A computer program product, comprising:
a computer-readable storage medium comprising:
code for causing at least one computer to iteratively determine, k times, a number of invalid mappings, σ, over a range of addresses until $\sigma^k(x)$ equals $\sigma^{k+1}(x)$ and
code for causing the at least one computer to determine a value, ø, representing a minimum number of addresses that must be skipped such that all addresses in a range from 0 to x have valid bit reversed mappings, said value ø being determined from $\sigma^k(x)$ when $\sigma^k(x)$ equals $\sigma^{k+1}(x)$.

2. A parallel lookahead pruned bit reversal interleaver (PLPBRI) comprising:
a plurality of hardware circuits operable to determine a value ø representing the minimum number of addresses that must be skipped such that all addresses in a range from 0 to x have valid bit reversed mappings; and
a plurality of sub-PLPBRIs each being coupled to a circuit from the plurality of circuits operable to determine the value ø, said sub-PLPBRIs being operable to output, in parallel, a valid bit-reversed value corresponding to a given address selected from a given range of addresses corresponding to each sub-PLPBRI.

3. The parallel lookahead pruned bit reversal interleaver as recited in claim 2 wherein the value of ø is determined according to the following method:
determining a number of invalid mappings, σ, over a first range of addresses [0, x+σ(x)], x being an address location;
determining a number of invalid mappings, σ, over a second range of addresses [0, x+σ²(x)]; and
determining a number of invalid mappings over a range spanning [0,x+σ^k(x)], for k steps until $\sigma^k(x)$ equals $\sigma^{k+1}(x)$.

4. The parallel lookahead pruned bit reversal interleaver as recited in claim 3 wherein said invalid mappings are determined according to a method of the following:
determining forms, i.e., classes of bit reversed address, which exceed a limit N, $N \leq 2^n$,
comparing bit reversed addresses against said classes; and discarding bit reversed addresses which exceed or equal N.

5. A method for parallel lookahead pruned bit reversal interleaving, comprising:
   iteratively determining, using a processor, k times, a number of invalid mappings, $\sigma$, over a range of addresses until $\sigma^k(x)$ equals $\sigma^{k+1}(x)$ and
   determining, using a processor, a value, ø, representing a minimum number of addresses that must be skipped such that all addresses in a range from 0 to x have valid bit reversed mappings, said value ø being determined from $\sigma^k(x)$ when $\sigma^k(x)$ equals $\sigma^{k+1}(x)$.

6. A processor for parallel lookahead pruned bit reversal interleaving, the processor configured to:
   iteratively determine, k times, a number of invalid mappings, $\sigma$, over a range of addresses until $\sigma^k(x)$ equals $\sigma^{k+1}(x)$ and
   determine a value, ø, representing the minimum number of addresses that must be skipped such that all addresses in a range from 0 to x have valid bit reversed mappings, said value ø being determined from $\sigma^k(x)$ when $\sigma^k(x)$ equals $\sigma^{k+1}(x)$.

7. An apparatus for parallel lookahead pruned bit reversal interleaving, comprising:
   means for iteratively determining, k times, a number of invalid mappings, $\sigma$, over a range of addresses until $\sigma^k(x)$ equals $\sigma^{k+1}(x)$ and
   means for determining a value, ø, representing a minimum number of addresses that must be skipped such that all addresses in a range from 0 to x have valid bit reversed mappings, said value ø being determined from $\sigma^k(x)$ when $\sigma^k(x)$ equals $\sigma^{k+1}(x)$.

8. A parallel lookahead pruned bit reversal interleaver, comprising:
   a hardware mapping circuit for iteratively determining, k times, a number of invalid mappings, $\sigma$, over a range of addresses until $\sigma^k(x)$ equals $\sigma^{k+1}(x)$ and
   an address validation circuit for determining a value, ø, representing a minimum number of addresses that must be skipped such that all addresses in a range from 0 to x have valid bit reversed mappings, said value ø being determined from $\sigma^k(x)$ when $\sigma^k(x)$ equals $\sigma^{k+1}(X)$.

9. A method for parallel lookahead pruned bit reversal interleaving comprising:
   determining, using a processor, a value ø representing a minimum number of addresses that must be skipped such that all addresses in a range from 0 to x have valid bit reversed mappings; and
   outputting, using a processor, in parallel, a valid bit-reversed value corresponding to a given address selected from a given range of addresses.

10. The method of claim 9 wherein the value of ø is determined according to the following method:
    determining, using a processor, a first number of invalid mappings, $\sigma$, over a first range of addresses [0, x+$\sigma$(x)], x being an address location;
    determining, using a processor, a second number of invalid mappings, $\sigma$, over a second range of addresses [0, x+$\sigma^2$(x)]; and
    determining, using a processor, a third number of invalid mappings over a range spanning [0,x+$\sigma^k$(x)], for k steps until $\sigma^k(x)$ equals $\sigma^{k+1}(x)$.

11. The method of claim 10 wherein the first, the second, and the third number of invalid mappings are determined according to a method of the following:
    determining, using a processor, classes of bit reversed address, which exceed a limit N, $N \leq 2^n$,
    comparing, using a processor, bit reversed addresses against said classes; and
    discarding, using a processor, bit reversed addresses which exceed or equal N.

12. A processor for parallel lookahead pruned bit reversal interleaving, the processor configured to:
    determine a value ø representing a minimum number of addresses that must be skipped such that all addresses in a range from 0 to x have valid bit reversed mappings; and
    output, in parallel, a valid bit-reversed value corresponding to a given address selected from a given range of addresses.

13. The processor of claim 12 wherein the processor is further configured to determine the value of ø according to the following method:
    determining a first number of invalid mappings, $\sigma$, over a first range of addresses [0, x+$\sigma$(x)], x being an address location;
    determining a second number of invalid mappings, $\sigma$, over a second range of addresses [0, x+$\sigma^2$(x)]; and
    determining a third number of invalid mappings over a range spanning [0,x+$\sigma^k$(x)], for k steps until $\sigma^k(x)$ equals $\sigma^{k+1}(x)$.

14. The processor of claim 13 wherein the processor is further configured to determine the first, the second, and the third number of invalid mappings according to the following method:
    determining classes of bit reversed address, which exceed a limit N, $N \leq 2^n$,
    comparing bit reversed addresses against said classes; and
    discarding bit reversed addresses which exceed or equal N.

15. A computer program product, comprising:
    a computer-readable storage medium loadable and executable by a computer comprising:
    code for causing determination of a value ø representing a minimum number of addresses that must be skipped such that all addresses in a range from 0 to x have valid bit reversed mappings; and
    code for causing outputting, in parallel, a valid bit-reversed value corresponding to a given address selected from a given range of addresses.

16. The computer program product of claim 15 wherein the computer readable storage medium further comprises code for determining the value of ø according to the following method:
    determining a first number of invalid mappings, $\sigma$, over a first range of addresses [0, x+$\sigma$(x)], x being an address location;
    determining a second number of invalid mappings, $\sigma$, over a second range of addresses [0, x+$\sigma^2$(x)]; and
    determining a third number of invalid mappings over a range spanning [0,x+$\sigma^k$(x)], for k steps until $\sigma^k(x)$ equals $\sigma^{k+1}(x)$.

17. The computer program product of claim 16 wherein the computer readable storage medium further comprises code for determining the first, the second, and the third number of invalid mappings according to the following method:
    determining classes of bit reversed address, which exceed a limit N, $N \leq 2^n$,
    comparing bit reversed addresses against said classes; and
    discarding bit reversed addresses which exceed or equal N.

18. An apparatus for parallel lookahead pruned bit reversal interleaving, comprising:
    means for determining a value ø representing a minimum number of addresses that must be skipped such that all addresses in a range from 0 to x have valid bit reversed mappings; and a plurality of means for sub-parallel lookahead pruned bit reversal interleaving each being coupled to a means for determining the value ø, said sub-parallel lookahead pruned bit reversal interleaving being operable to output, in parallel, a valid bit-reversed value corresponding to a given address selected from a given range of addresses corresponding to each sub-parallel lookahead pruned bit reversal interleaving.

19. The apparatus for parallel lookahead pruned bit reversal interleaving as recited in claim 18 further comprising means for determining the value of ø according to the following method:

> determining a first number of invalid mappings, $\sigma$, over a first range of addresses $[0, x+\sigma(x)]$, x being an address location;
> 
> determining a second number of invalid mappings, $\sigma$, over a second range of addresses $[0, x+\sigma^2(x)]$; and
> 
> determining a third number of invalid mappings over a range spanning $[0, x+\sigma^k(x)]$, for k steps until $\sigma^k+(x)$ equals $\sigma^{k+1}(x)$.

20. The apparatus for parallel lookahead pruned bit reversal interleaving as recited in claim 19 wherein further comprising means for determining said the first, the second, and the third number of invalid mappings according to a method of the following:

> determining classes of bit reversed address, which exceed a limit N, $N \leq 2^n$,
> 
> comparing bit reversed addresses against said classes; and
> 
> discarding bit reversed addresses which exceed or equal N.

\* \* \* \* \*